(12) United States Patent
Meng et al.

(10) Patent No.: US 7,968,875 B2
(45) Date of Patent: Jun. 28, 2011

(54) ORGANIC PHOTOSENSITIVE OPTOELECTRONIC DEVICE

(75) Inventors: Hsin-Fei Meng, Hsinchu (TW);
Sheng-Fu Hong, Hsinchu (TW);
Hsin-Rong Tseng, Hsinchu (TW);
En-Chen Chen, Hsinchu (TW);
Chia-Hung Chu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 166 days.

(21) Appl. No.: 12/500,830

(22) Filed: Jul. 10, 2009

(65) Prior Publication Data
US 2010/0283039 A1    Nov. 11, 2010

(30) Foreign Application Priority Data
May 5, 2009 (TW) ................................ 98114786 A

(51) Int. Cl.
*H01L 51/42* (2006.01)
(52) U.S. Cl. .................................. 257/40; 257/E51.012
(58) Field of Classification Search .................... 257/40, 257/E51.012
See application file for complete search history.

(56) References Cited

U.S. PATENT DOCUMENTS
7,230,269 B2 * 6/2007 Rand et al. ....................... 257/40
7,365,360 B2 * 4/2008 Kang et al. ...................... 257/40
* cited by examiner

*Primary Examiner* — Trung Dang
(74) *Attorney, Agent, or Firm* — Peter F. Corless; Steven M. Jensen; Edwards Angell Palmer & Dodge LLP

(57) ABSTRACT

An organic photosensitive optoelectronic device includes an anode, an organic photosensitive layer formed on the anode and having a donor portion and an acceptor portion, a hole blocking layer formed on the organic photosensitive layer so as for the organic photosensitive layer to be sandwiched between the anode and the hole blocking layer, and a cathode formed on the hole blocking layer so as for the hole blocking layer to be sandwiched between the cathode and the organic photosensitive layer. The highest occupied molecular orbitals (HOMO) of the hole blocking layer is at least 0.3 eV higher than that of the donor portion. Therefore, the optoelectronic device efficiently suppresses dark current so as to enhance sensitivity when applied to a detector.

15 Claims, 4 Drawing Sheets

ORGANIC PHOTOSENSITIVE OPTOELECTRONIC DEVICE

BACKGROUND OF THE INVENTION

1. Field of the Invention

The present invention relates to organic photosensitive optoelectronic devices, and more particularly to an organic light detector capable of suppressing dark current.

2. Description of Related Art

Optoelectronic devices such as LEDs, solar cells and light detectors produce electromagnetic radiation or electrical current by using optical or electrical properties of materials forming the devices.

For example, a light detector utilizes a photosensitive element to convert an optical signal into an electrical signal. Generally, the photosensitive element detects light of a wavelength near the visible spectrum. In particular, after the photosensitive material of the photosensitive element absorbs electromagnetic radiation, it produces an excited molecular state, i.e., an exciton with an electron-hole pair. When the electron-hole pair is separated, a photocurrent is produced. To speed up the absorption of carriers by the anode and cathode, a reverse bias is usually applied, which however causes injection of carriers from the anode or cathode to be reversely injected into the photosensitive material, thus resulting in inaccuracy of the current value measured by the detector.

WO2007/017475 discloses an organic light detector with an electron blocking layer for blocking dark current produced by injection of electrons from an anode to an active layer. However, since in the prior art only the electron blocking layer are used to block the electrons injected from the anode to the active layer, the low work function metal electrodes are utilized which are usually unstable, thereby reducing the lifetime of the device.

Therefore, there is a need to provide an organic photosensitive optoelectronic device capable of reducing dark current and providing options of metal electrodes of more stable materials so as to enhance sensitivity and lifetime of the optoelectronic device and to overcome the above drawbacks.

SUMMARY OF THE INVENTION

According to the above drawback, an object of the present invention is to provide an organic photosensitive optoelectronic device capable of suppressing dark current.

Another object of the present invention is to provide an organic photosensitive optoelectronic device with improved sensitivity.

A further object of the present invention is to provide an organic photosensitive optoelectronic device with increased lifetime.

Still another object of the present invention is to provide a light detection device.

In order to achieve the above and other objects, an embodiment of the present invention provides an organic photosensitive optoelectronic device, which comprises: an anode; an organic photosensitive layer formed on the anode, the organic photosensitive layer having mixed acceptor portion and donor portion; a hole blocking layer formed on the organic photosensitive layer such that the organic photosensitive layer is sandwiched between the anode and the hole blocking layer; and a cathode formed on the hole blocking layer such that the hole blocking layer is sandwiched between the cathode and the organic photosensitive layer, wherein the highest occupied molecular orbital (HOMO) of the hole blocking layer is at least 0.3 eV higher than that of the donor portion so as to block injection of holes from the cathode to the organic photosensitive layer, thereby suppressing dark current.

According to another embodiment of the present invention, an organic photosensitive optoelectronic device comprises: an anode; an organic photosensitive layer formed on the anode, wherein, the organic photosensitive layer comprises: a hole blocking layer functioning as an acceptor portion, and an electron blocking layer formed between the anode and the hole blocking layer and functioning as a donor portion; and a cathode formed on the organic photosensitive layer such that the organic photosensitive layer is sandwiched between the anode and the cathode; wherein the lowest unoccupied molecular orbital (LUMO) of the electron blocking layer is at least 0.3 eV lower than that of the hole blocking layer and the HOMO of the hole blocking layer is at least 0.3 eV higher than that of the electron blocking layer so as to block injection of electrons from the anode and holes from the cathode to the organic photosensitive layer, thereby suppressing dark current.

According to an further embodiment, the present invention provides a light detection device, which comprises: an organic photosensitive optoelectronic device of the present invention, and a current detection element electrically connected to the optoelectronic device.

Therefore, the hole blocking layer of the organic photosensitive optoelectronic device of the present invention can efficiently block injection of holes from the cathode to the photosensitive layer so as to reduce dark current and increase sensitivity of the light detection device. The relationship between the work function of the electrodes and the energy level of the photosensitive material is provided and the electrodes of the present invention are not limited to the metal with an extremely low work function. Instead, metals with higher work functions can be used as the electrodes, thereby increasing the lifetime of the light detection device.

DETAILED DESCRIPTION OF PREFERRED EMBODIMENTS

The following illustrative embodiments are provided to illustrate the disclosure of the present invention, these and other advantages and effects can be apparent to those ordinarily skilled in the art after reading the disclosure of this specification.

Figure 1A:
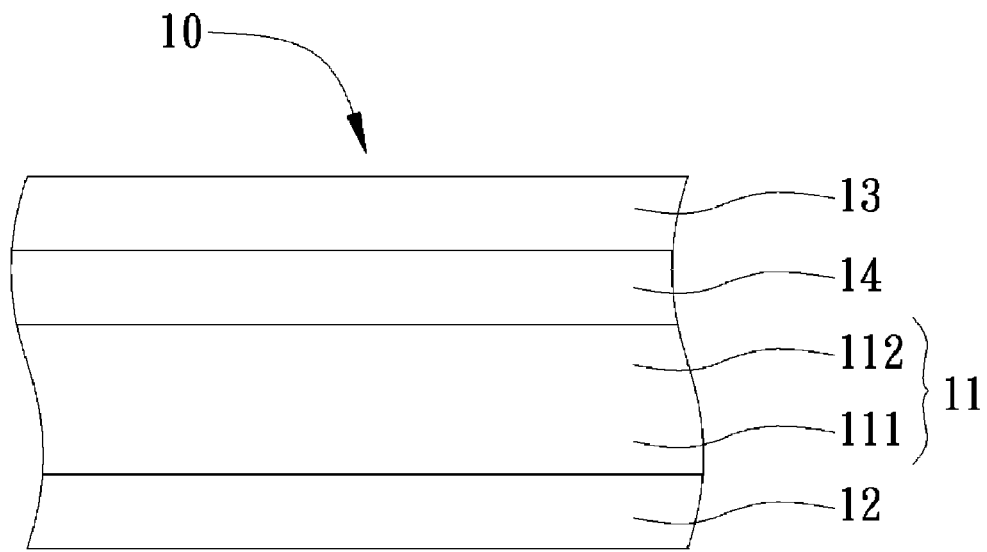
FIGS. 1A and 1B are schematic sectional diagrams of an organic photosensitive optoelectronic device of the present invention.

An organic photosensitive optoelectronic device of the present invention comprises at least a photosensitive region for absorbing electromagnetic radiation of light so as to form excitions that are subsequently dissociated into electrons and holes. FIG. 1A shows an organic photosensitive optoelectronic device 10 according to an embodiment of the present invention. As shown in FIG. 1A, the organic photosensitive optoelectronic device 10 comprises: an organic photosensitive layer 11 for absorbing light, an anode 12 in contact with the organic photosensitive layer 11, a hole blocking layer 14 formed on the organic photosensitive layer 11, and a cathode 13 formed on the hole blocking layer 14. Therein, the organic photosensitive layer 11 further comprises a donor portion 111 and an acceptor portion 112, and the electrodes are disposed at two sides of the organic photosensitive layer 11 for transmitting generated current to an external circuit or providing bias to the optoelectronic device of the present invention. The hole blocking layer 14 is sandwiched between the organic photosensitive layer 11 and the cathode 13 for blocking injection of holes from the cathode 13 to the organic photosensitive layer 11.

The donor portion and the acceptor portion are substantially plate-shaped or sheet-shaped laminated bodies.

In an embodiment of the present invention, the electrodes can be made of a metal material or an alternative material. Therein, the metal material refers to a material comprising a metal element or an alloy, and the alternative material refers to a material having metal properties such as a doped semiconductor or a transparent conductive oxide, for example, Indium Tin Oxide (ITO). Generally, ITO is used as an anode.

Figure 1B:
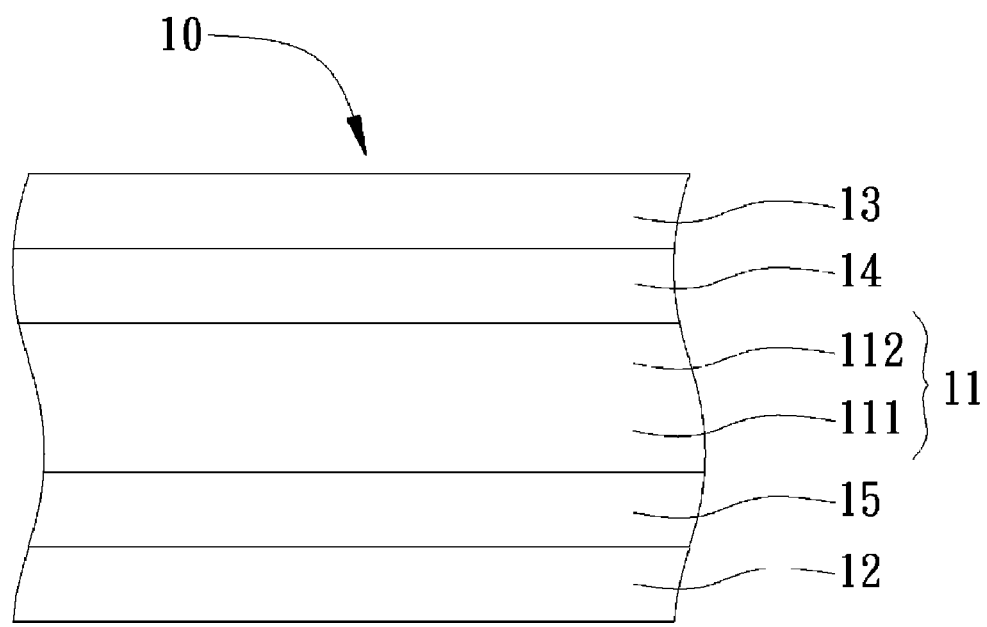

As shown in FIG. 1B, the optoelectronic device 10 further comprises an electron blocking layer 15 formed between the organic photosensitive layer 11 and the anode 12 so as to block injection of electrons from the anode 12 to the organic photosensitive layer 11.

The donor portion according to an embodiment of the present invention refers to such as a P-type semiconductor and the acceptor portion refers to such as a N-type semiconductor. Further, the organic photosensitive layer is made of an organic semiconductor material. The organic semiconductor material refers to an organic polymeric material or an organic small molecule material that conducts electricity when the movement of charge carriers occurs through thermal or electromagnetic excitation. Therefore, the organic semiconductor material has a significant carrier mobility. The mobility measures the ease with which a charge carrier moves through a conductive material in response to an electrical field. A material with high electron mobility is generally referred to as an electron transport material. A material with high hole mobility is referred to as a hole transport material. In the optoelectronic device of the present invention, the donor portion is preferably, but not necessarily, a hole transport material, and the acceptor portion is preferably, but not necessarily, an electron transport material. In an embodiment of the present invention, the donor portion may be made of such as poly(3-hexylthiophene) (P3HT) or pentacene, and the acceptor portion may be made of such as PCBM ([6,6]-phenyl C61-butyric acid methyl ester), zinc oxide (ZnO) or titanium dioxide ($TiO_2$).

Figure 2A:
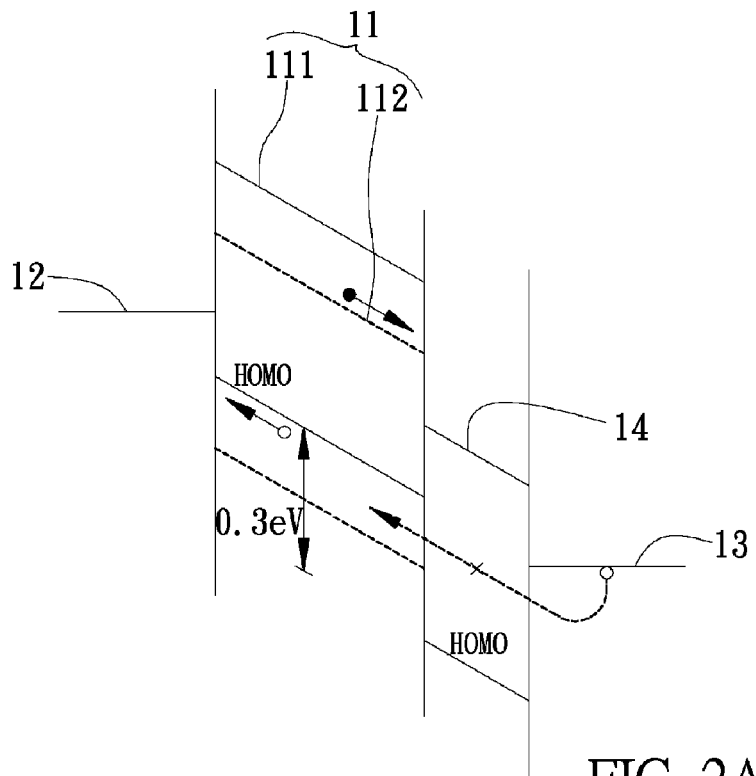
FIGS. 2A and 2B are energy level diagrams of the organic photosensitive optoelectronic device of the present invention.

The hole blocking layer is formed between the organic photosensitive layer and the cathode so as to block injection of holes from the cathode to the organic photosensitive layer, thereby reducing dark current. Preferably, as shown in FIG. 2A, the highest occupied molecular orbital (HOMO) of the hole blocking layer 14 is at least 0.3 eV higher than that of the donor portion 111, thereby efficiently blocking injection of holes (hollow circle) from the cathode 13 to the organic photosensitive layer 11.

In addition, it is found when the HOMO of the hole blocking layer is at least 0.3 eV higher than the work function of the cathode, injection of holes from the cathode to the organic photosensitive layer can also be efficiently blocked. Due to the difference in energy level, a stable metal having higher work function can be used as the cathode, thereby increasing the lifetime of the device.

Figure 2B:
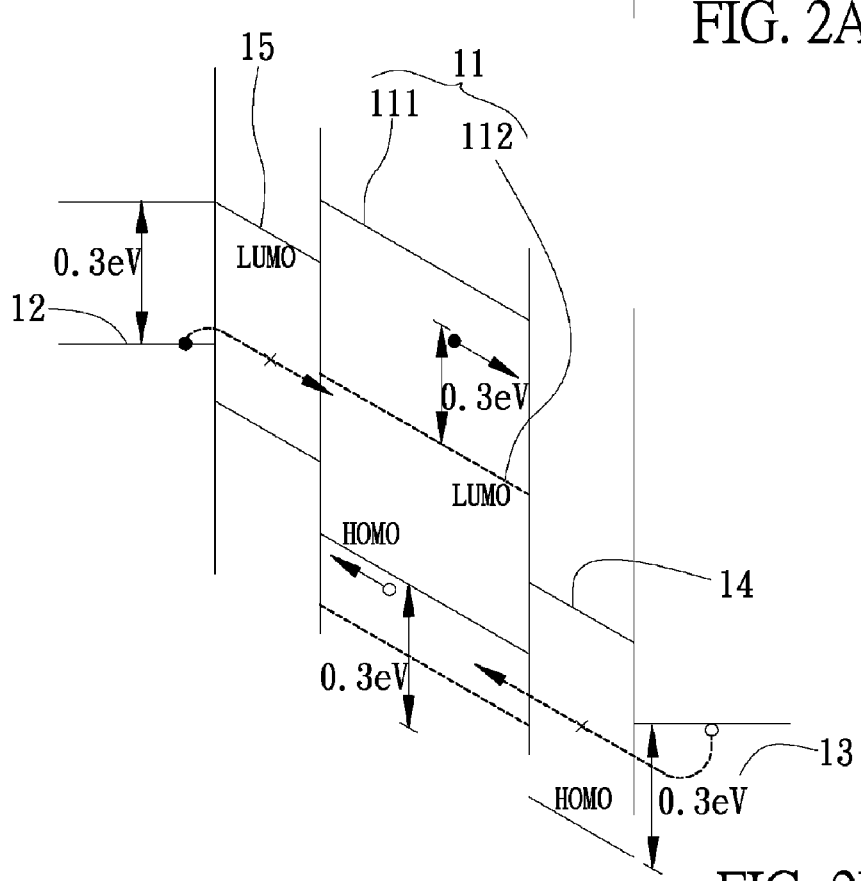

In a preferred embodiment, the electron blocking layer is further formed between the organic photosensitive layer and the anode for blocking injection of electrons from the anode to the organic photosensitive layer. Preferably, as shown in FIG. 2B, the lowest unoccupied molecular orbital (LUMO) of the electron blocking layer 15 is at least 0.3 eV lower than that of the acceptor portion 112. In the embodiment, the electron blocking layer 15 and the hole blocking layer 14 of the organic photosensitive optoelectronic device are respectively used for blocking injection of electrons (solid circle) and holes from the electrodes to the organic photosensitive layer, thereby reducing dark current (dashed line). When the optoelectronic device of the present invention is applied to a detector, the sensitivity of the detector can be increased.

On the other hand, when the LUMO of the electron blocking layer is at least 0.3 eV lower than the work function of the anode, injection of electrons from the anode to the organic photosensitive layer also can be blocked. Generally, a metal with low work function is used as the anode. But when the LUMO of the electron blocking layer is at least 0.3 eV lower than the work function of the anode, a metal with higher work function can be used as the anode, thereby increasing the lifetime and stability of the device. Further, since the type of metal is not important, cheaper metals can be used as the electrodes so as to reduce the fabrication cost.

Figure 3:
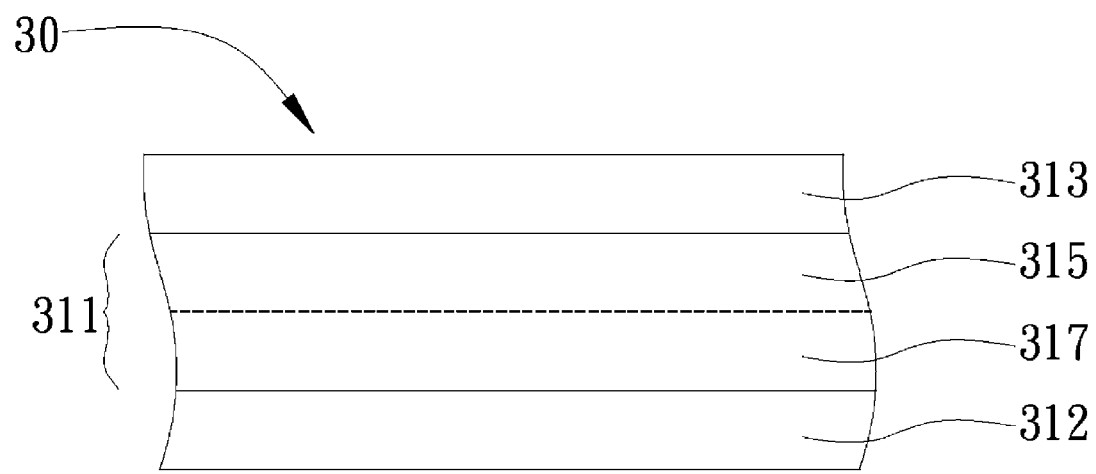
FIG. 3 is a schematic sectional diagram of an organic photosensitive optoelectronic device according to another embodiment of the present invention.

FIG. 3 shows an organic photosensitive optoelectronic device according to another embodiment of the present invention. The organic photosensitive optoelectronic device 30 comprises an anode 312; an organic photosensitive layer 311 formed on the anode 312, wherein the organic photosensitive layer 311 comprises a hole blocking layer 315 functioning as an acceptor portion and an electron blocking layer 317 formed between the anode 312 and the hole blocking layer 315 and functioning as a donor portion; and a cathode 313 formed on the organic photosensitive layer 311 such that the organic photosensitive layer 311 is sandwiched between the anode 312 and the cathode 313. Therein, the LUMO of the electron blocking layer 317 is at least 0.3 eV lower than that of the hole blocking layer 315, and the HOMO of the hole blocking layer 315 is at least 0.3 eV higher than that of the electron blocking layer 317.

In the present embodiment, the hole blocking layer functions as the acceptor portion and the electron blocking layer functions as the donor portion. In addition, if needed, the HOMO of the hole blocking layer is at least 0.3 eV higher than the work function of the cathode, or, the LUMO of the electron blocking layer is at least 0.3 eV lower than the work function of the anode. Also, if needed, the HOMO of the hole blocking layer is at least 0.3 eV higher than the work function of the cathode, and the LUMO of the electron blocking layer is at least 0.3 eV lower than the work function of the anode. Therefore, as described above, metals with high work function can be used as the electrodes of the present invention, thereby increasing the lifetime and stability of the device. Meanwhile, since the type of metal is not important, cheaper metals can be used as the electrodes so as to reduce the fabrication cost.

The organic photosensitive layer, the donor portion and the acceptor portion of the present invention can be fabricated by vacuum deposition, spin coating, organic vapor deposition, ink-jet printing or any suitable process known in the art.

Figure 4A:
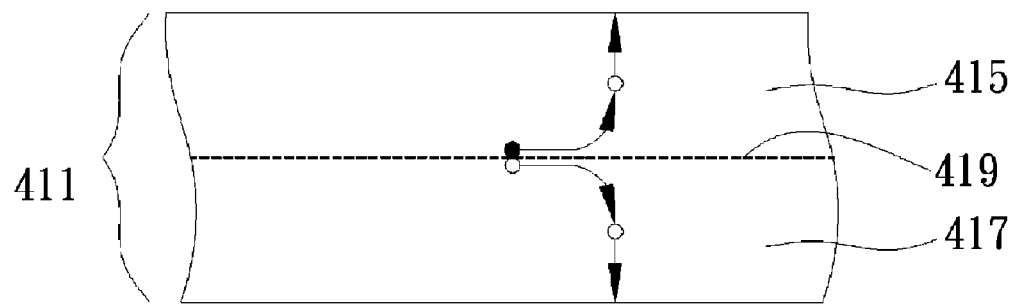
FIGS. 4A and 4B are schematic diagrams showing an interface between a donor portion and an acceptor portion of the present invention.
Figure 4B:
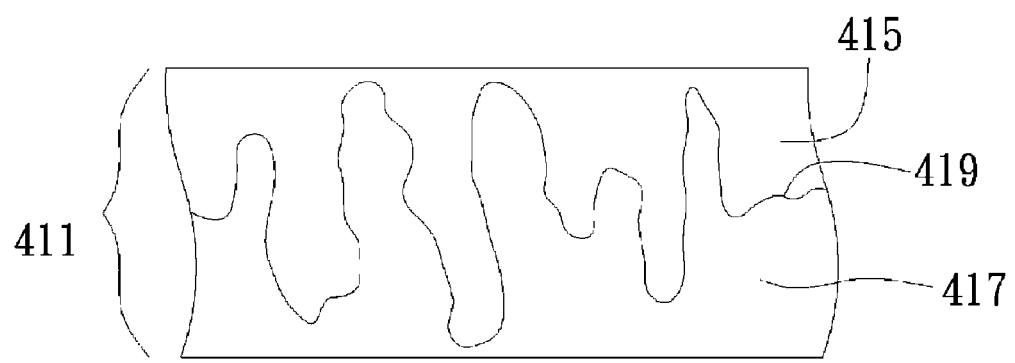

FIGS. 4A and 4B show an interface between a donor portion 417 and an acceptor portion 415. In general, the donor portion 417 and the acceptor portion 415 of an organic photosensitive layer 411 have at least an interface 419 formed therebewteen. The interface 419 can be a flat interface (as shown in FIG. 4A). Alternatively, the interface 419 is a nonflat interface formed between layers. In particular, at least one layer of the donor portion 417 and the acceptor portion 415 has a porous surface structure or an irregular surface (as shown in FIG. 4B) such that an irregular interface 419 is formed between the layers. Therefore, the organic photosensitive layer of the present invention, which comprises at least an acceptor and at least a donor portion that are mixed, has a plurality of irregular interfaces (not shown) formed between the donor portion and the acceptor portion.

For example, in the embodiment that uses the hole blocking layer as the acceptor portion and the electron blocking layer as the donor portion, at least one layer of the hole blocking layer and the electron blocking layer has a porous surface structure or an irregular surface such that an irregular interface is formed between the layers. In general, the irregular surface is helpful to increase the number of heterogeneous interfaces for electron-hole dissociation. Therefore, materials having high mobility can be used as the donor portion and acceptor portion. For example, according to the above-described energy level differences, the LUMO of the electron blocking layer 317 is at least 0.3 eV lower than that of the hole blocking layer 315, and the HOMO of the hole blocking layer 315 is at least 0.3 eV higher than that of the electron blocking layer 317.

In addition, in a preferred embodiment, the electron blocking layer and hole blocking layer have a thickness of approximately 300 to 500 Å, respectively, and the thickness of the organic photosensitive layer can be adjusted according to the thickness of the electron blocking layer and the hole blocking layer such that the total thickness is approximately 2500 Å. Meanwhile, it is preferable that the organic photosensitive layer is formed of mixed donor and acceptor materials. Generally, the donor material and the acceptor material can be mixed in any ratio for forming the organic photosensitive layer. In the following embodiments, 50 wt % of the donor material and 50 wt % of the acceptor material are mixed with each other. Further, It should be noted that the above-described 0.3 eV energy level difference such as between the HOMO of the hole blocking layer and the donor portion is a lower limit value verified through experiments. The following specific examples are provided to illustrate the present invention, but are not intended to limit the scope of the present invention.

EXAMPLES

Table 1 shows the work function, LUMO and HOMO of different materials, respectively.

TABLE 1

|  | ITO | Ca | Al | PEDOT | P3HT | PCBM |
| --- | --- | --- | --- | --- | --- | --- |
| Work function (eV) | 4.8 | 2.9 | 4.3 | — | — | — |
| LUMO (eV) | — | — | — | — | 3 | 3.7 |
| HOMO (eV) | — | — | — | 5.2 | 5.1 | 6.1 |

Example 1

Fabricating an Organic Photosensitive Optoelectronic Device of the Present Invention In the example, an ITO glass substrate, which functions as an anode and has a thickness of 2000 Å, is cleaned by acetone, a poly(3,4-ethylenedioxythiophene) (PEDOT) solution is spin coated on the glass substrate and after the solvent is removed, a hole transport layer having a thickness of 400 Å is formed. Subsequently, a P3HT solution is spin coated on the hole transport layer, and after the solvent is removed, an electron blocking layer having a thickness of approximately 300 Å is formed. Subsequently, a P3HT:PCBM solution of weight ratio 1:1 is spin coated on the electron blocking layer, and after the solvent is removed, an organic photosensitive layer having a thickness of 1900 Å is formed. Then, in a similar way, a PCBM hole blocking layer having a thickness of 300 Å, a calcium metal layer having a thickness of 350 Å and an aluminum metal layer having a thickness of 1000 Å functioning as the cathode are sequentially formed on the organic photosensitive layer.

The characteristics of the device according to the present example are shown in Table 2.

Example 2

Fabricating an Optoelectronic Device without the Electron Blocking Layer and the Hole Blocking Layer In the example, an ITO glass substrate functioning as an anode and having a thickness of 2000 Å is cleaned by acetone, a PEDOT solution is spin coated on the glass substrate and after the solvent is removed, a hole transport layer having a thickness of 400 Å is formed. Subsequently, a P3HT layer functioning as a donor portion and a PCBM layer functioning as an acceptor portion are sequentially formed, thereby obtaining an organic photosensitive layer having the donor portion and the acceptor portion and having a total thickness of 2500 Å. Then, in a similar way, a calcium metal layer having a thickness of 350 Å and an aluminum metal layer having a thickness of 1000 Å are sequentially formed on the organic photosensitive layer.

The characteristics of the device according to the present example are shown in Table 2.

Example 3

Fabricating an Optoelectronic Device without the Electron Blocking Layer and the Hole Blocking Layer In the example, an ITO glass substrate functioning as an anode and having a thickness of 2000 Å is cleaned by acetone, a PEDOT solution is spin coated on the glass substrate and after the solvent is removed, a hole transport layer having a thickness of 400 Å is formed. Subsequently, a P3HT:PCBM blending solution is spin coated on the hole transport layer, and after the solvent is removed, an organic photosensitive layer having a thickness of 2500 Å is formed. Then, in a similar way, a calcium metal layer having a thickness of 350 Å and an aluminum metal layer having a thickness of 1000 Å are sequentially formed on the organic photosensitive layer.

The characteristics of the device according to the present example are shown in Table 2.

Example 4

Fabricating an Optoelectronic Device with an Electron Blocking Layer

The method of the present example is similar to example 3. A difference of the present example from example 3 resides in that, before the organic photosensitive layer is formed, a P3HT solution is spin coated on the hole transport layer, and after the solvent is removed, an electron blocking layer having a thickness of 300 Å is formed. In addition, the organic photosensitive layer has a thickness of 2200 Å.

The characteristics of the device according to the present example are shown in Table 2.

Example 5

Fabricating an Optoelectronic Device with a Hole Blocking Layer

The method of the present example is similar to example 3. A difference of the present example from example 3 is before the calcium metal layer is formed, a PCBM solution is spin coated on the organic photosensitive layer, and after the solvent is removed, a hole blocking layer having a thickness of 300 Å is formed. In addition, the organic photosensitive layer has a thickness of 2200 Å.

The characteristics of the device according to the present example are shown in Table 2.

| | Electron blocking layer | Organic photosensitive layer | Hole blocking layer | Operation voltage (V) | Dark current mA/cm$^2$ |
|---|---|---|---|---|---|
| Example 1 | P3HT | P3HT:PCBM | PCBM | −10 | 9.307 × 10$^{-4}$ |
| Example 2 | — | P3HT/PCBM | — | −10 | 0.004 |
| Example 3 | | P3HT:PCBM | | −10 | 0.007 |
| Example 4 | P3HT | P3HT:PCBM | | −10 | 0.0013 |
| Example 5 | | P3HT:PCBM | PCBM | −10 | 0.0021 |

If the energy level relationships between different layers do not meet the above described conditions such as the HOMO of the hole blocking layer is at least 0.3 eV higher than that of the donor portion and the LUMO of the electron blocking layer is at least 0.3 eV lower than that of the acceptor portion, the dark current is generally higher than 0.007 mA/cm$^2$. However, as shown in Table 2, even if the optoelectronic device does not comprise the electron blocking layer and the hole blocking, as long as the energy level of the materials forming the donor portion and the acceptor portion of the organic photosensitive layer meets the disclosure of the present invention, the dark current can be reduced to 0.004 mA/cm$^2$. Furthermore, if the optoelectronic layer comprises both the electron blocking layer and the hole blocking layers, the dark current can be reduced to 9.307×10$^{-4}$ mA/cm$^2$.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. An organic photosensitive optoelectronic device, comprising:
   an anode;
   an organic photosensitive layer formed on the anode, the organic photosensitive layer having an acceptor portion and a donor portion which are mixed;
   a hole blocking layer formed on the organic photosensitive layer such that the organic photosensitive layer is sandwiched between the anode and the hole blocking layer; and
   a cathode formed on the hole blocking layer such that the hole blocking layer is sandwiched between the cathode and the organic photosensitive layer,
   wherein a highest occupied molecular orbital (HOMO) of the hole blocking layer is at least 0.3 eV higher than that of the donor portion such that injection of holes from the cathode to the organic photosensitive layer can be blocked, thereby suppressing dark current.

2. The device of claim 1, further comprising an electron blocking layer formed between the organic photosensitive layer and the anode.

3. The device of claim 1, wherein the HOMO of the hole blocking layer is at least 0.3 eV higher than a work function of the cathode.

4. The device of claim 2, wherein a lowest unoccupied molecular orbital (LUMO) of the electron blocking layer is at least 0.3 eV lower than that of the acceptor portion.

5. The device of claim 4, wherein the LUMO of the electron blocking layer is at least 0.3 eV lower than the work function of the anode.

6. The device of claim 1, wherein the donor portion is made of either P3HT or pentacene.

7. The device of claim 1, wherein the acceptor portion is made of one of PCBM, ZnO and TiO$_2$.

8. An organic photosensitive optoelectronic device, comprising:
   an anode;
   an organic photosensitive layer formed on the anode, wherein the organic photosensitive layer comprises: a hole blocking layer functioning as an acceptor portion, and an electron blocking layer formed between the anode and the hole blocking layer and functioning as a donor portion; and
   a cathode formed on the organic photosensitive layer such that the organic photosensitive layer is sandwiched between the anode and the cathode;
   wherein a lowest unoccupied molecular orbital (LUMO) of the electron blocking layer is at least 0.3 eV lower than that of the hole blocking layer, and a highest occupied molecular orbital (HOMO) of the hole blocking layer is at least 0.3 eV higher than that of the electron blocking layer, so as to block injection of electrons from the anode to the organic photosensitive layer and block injection of holes from the cathode to the organic photosensitive layer, thereby suppressing dark current.

9. The device of claim 8, wherein the HOMO of the hole blocking layer is at least 0.3 eV higher than a work function of the cathode.

10. The device of claim 8, wherein the LUMO of the electron blocking layer is at least 0.3 eV lower than a work function of the anode.

11. The device of claim 8, wherein the hole blocking layer has a porous surface structure or an irregular surface.

12. The device of claim 11, wherein the hole blocking layer is made of either ZnO or TiO$_2$.

13. The device of claim 8, wherein the electron blocking layer has a porous surface structure or an irregular surface.

14. The device of claim 8, wherein the electron blocking layer is made of either P3HT or pentacene.

15. A light detection device, comprising an organic photosensitive optoelectronic device of claim 1 or 8, and a current detection element electrically connected to the optoelectronic device.

* * * * *